(12) United States Patent
Chih et al.

(10) Patent No.: US 12,399,432 B2
(45) Date of Patent: Aug. 26, 2025

(54) SEMICONDUCTOR FABRICATION APPARATUS AND METHOD OF USING THE SAME

(71) Applicant: Taiwan Semiconductor Manufacturing Company, Ltd., Hsinchu (TW)

(72) Inventors: Yu-Der Chih, Hsinchu (TW); May-Be Chen, Hsinchu (TW); Ya-Chin King, Taipei (TW); Chrong Jung Lin, Hsinchu (TW); Burn Jeng Lin, Hsinchu (TW); Bo Yu Lin, Tainan (TW)

(73) Assignee: Taiwan Semiconductor Manufacturing Company, Ltd., Hisinchu (TW)

( * ) Notice: Subject to any disclaimer, the term of this patent is extended or adjusted under 35 U.S.C. 154(b) by 812 days.

(21) Appl. No.: 17/560,039

(22) Filed: Dec. 22, 2021

(65) Prior Publication Data
US 2022/0252989 A1   Aug. 11, 2022

Related U.S. Application Data

(60) Provisional application No. 63/148,407, filed on Feb. 11, 2021.

(51) Int. Cl.
    *G03F 7/00* (2006.01)
    *H01L 21/027* (2006.01)
    *H01L 21/66* (2006.01)

(52) U.S. Cl.
    CPC ...... *G03F 7/70308* (2013.01); *H01L 21/0274* (2013.01); *H01L 22/20* (2013.01)

(58) Field of Classification Search
    CPC ............... G03F 7/70308; G03F 7/7085; G03F 7/70558; G03F 7/70425; H01L 21/0274; H01L 22/20; H01L 21/67253
    See application file for complete search history.

(56) References Cited

U.S. PATENT DOCUMENTS

| | | | |
|---|---|---|---|
| 5,933,220 | A | 8/1999 | Park |
| 8,319,307 | B1 | 11/2012 | Williams |

(Continued)

FOREIGN PATENT DOCUMENTS

| | | | |
|---|---|---|---|
| CN | 103023357 A | 4/2013 | |
| CN | 110658685 A | 1/2020 | |

(Continued)

OTHER PUBLICATIONS

Office Action issued in connection with Taiwan Appl. No. 111103211 dated Dec. 28, 2023.

(Continued)

*Primary Examiner* — Hung V Nguyen
(74) *Attorney, Agent, or Firm* — FOLEY & LARDNER LLP

(57) ABSTRACT

A semiconductor fabrication apparatus and a method of using the same are disclosed. In one aspect, the apparatus includes a holder configured to place a substrate and a radiation source configured to provide radiation to transfer a pattern onto the substrate. The apparatus also includes a plurality of sensing devices configured to provide a reference signal based on an intensity of the radiation when the substrate is not present. The apparatus further includes a controller, operatively coupled to the plurality of sensing devices, configured to adjust the intensity of the radiation based on the reference signal.

20 Claims, 7 Drawing Sheets

(56) References Cited

U.S. PATENT DOCUMENTS

| | | | | |
|---|---|---|---|---|
| 8,547,526 B2* | 10/2013 | Stanton | ............... | G03B 27/72 |
| | | | | 355/71 |
| 9,691,646 B2* | 6/2017 | Kurusu | ............ | H01L 21/02041 |
| 10,120,283 B2* | 11/2018 | Mizuno | ............... | G03F 7/70133 |
| 10,222,293 B2* | 3/2019 | Ooki | ............... | G01M 11/0264 |
| 10,627,724 B2* | 4/2020 | Everts | ............... | G03F 7/70525 |
| 2014/0218703 A1 | 8/2014 | Mizuno | | |
| 2015/0318194 A1 | 11/2015 | Kurusu et al. | | |

FOREIGN PATENT DOCUMENTS

| TW | 201320570 A | 5/2013 |
|---|---|---|
| TW | 201712438 A | 4/2017 |

OTHER PUBLICATIONS

Office Action issued in connection with Chinese Appl. No. 202210112360.5 dated Apr. 30, 2025.

\* cited by examiner

SEMICONDUCTOR FABRICATION APPARATUS AND METHOD OF USING THE SAME

CROSS-REFERENCE TO RELATED APPLICATION

This application claims priority to and the benefit of U.S. Provisional Application No. 63/148,407, filed Feb. 11, 2021, entitled "NOVEL LITHOGRAPHY APPARATUS AND METHOD," which is incorporated herein by reference in its entirety for all purposes.

BACKGROUND

The semiconductor integrated circuit (IC) industry has experienced exponential growth. Technological advances in IC materials and design have produced generations of ICs where each generation has smaller and more complex circuits than the previous generation. As devices become smaller, one area that is in need of continued improvement is the fabrication process which involves photolithographic processes. Generally, a wafer is exposed to a type of radiation source to form a pattern on the wafer. Then materials on the wafer are either etched away or deposited to form layers on the wafer. These layers are combined and connected to form electronic devices and circuits. However, as the devices become smaller, it is becoming increasingly difficult to fabricate the devices with uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
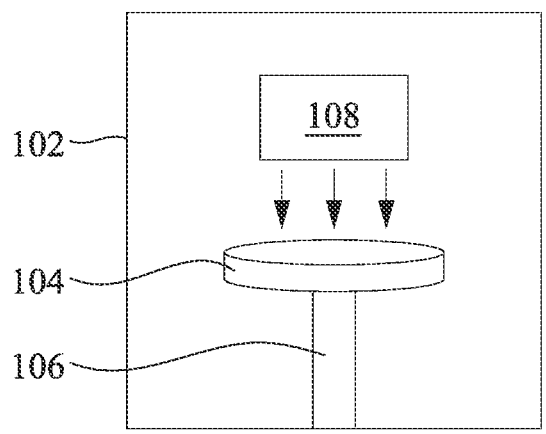
FIGS. 1A and 1B illustrate diagrams of a semiconductor fabrication apparatus, according to embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As electronic devices become smaller, it is becoming increasingly difficult to have uniformity in the devices across the wafer. One area that is critical in fabricating uniform devices is the radiation source used for lithography. Because the radiation source is typically kept on in order to maximize consistency, uniformity and throughput, the radiation source is desired to be reliable at all times. One way to measure whether the radiation source is exposing the wafer to uniform light or electrons across the entire wafer is to use complementary metal oxide semiconductor (CMOS) image sensor (CIS) methods. Typically for a CMOS image sensor, a photodetector is connected to a set of CMOS transistors. The photodetector senses the light which drives up the output voltage, allowing the transistors to detect the amount of light that is shined on the photodetector. However, there are several drawbacks to this method. First, this method is not compatible with the latest CMOS processes such as 3-dimensional transistors, etc. Also, the sensitivities to extreme ultraviolet (EUV) light is low because the light gets absorbed in various layers before the photodetector can detect the light. And CMOS image sensors typically require an external power supply or battery which drives up costs and resources. Furthermore, when multiple wafers are exposed consecutively, the user does not know whether the exposures are uniformly applied across the wafer every time.

Accordingly, there is a need for detecting the uniformity of a radiation source that does not have these drawbacks or at least limits them.

A semiconductor fabrication apparatus of the present disclosure is able to achieve greater uniformity of radiation exposure to a wafer. The apparatus includes a plurality of energy sensing pads that are disposed on a chuck (or holder) that typically holds the wafer during processing steps such as exposure. In between exposure steps, the radiation intensity of the radiation source can be adjusted by sensing the intensity that is detected or determined at the energy sensing pads disposed on the chuck. The apparatus can accurately detect a variety of radiation including, but not limited to, EUV and e-beams. The apparatus is compatible for general CMOS fabrication processes. And at least some of the embodiments can be self-powered such that an external power supply or battery is not necessary, which can help save time and resources. Furthermore, when using the disclosed technology, the user can know that the wafers are uniformly exposed or within a predetermined threshold.

Referring to FIG. 1A, a semiconductor fabrication apparatus 100A is shown, in accordance with some embodiments. The semiconductor fabrication apparatus 100A includes a chamber 102 which includes a chuck (or holder) 104, a shaft 106, and a radiation source 108. FIG. 1A is a simplified view of an example semiconductor fabrication apparatus and one of ordinary skill in the art will recognize that there are a variety of parts that may be added or removed from the semiconductor fabrication apparatus 100A.

The chuck 104 can include a plurality of energy sensing pads (see, e.g., FIG. 2A) that are disposed on a top surface that faces a radiation source 108. In some embodiments, such energy sensing pads can receive radiation from the radiation source 108, when the top surface of the chuck 104 is exposed (e.g., placing no substrate). The shaft 106 holds the chuck 104 with the energy sensing pads. There can be circuitry disposed within or on the bottom of the chuck 104, and the circuitry can help convert the radiation intensity into a signal (e.g., electrical or reference signal) that can be detected and analyzed. Once the radiation intensity is analyzed, the radiation source 108 or portions thereof can be adjusted to increase or decrease the intensity so that the next wafer that is placed on the chuck 104 can be exposed to the radiation source 108 uniformly or at least more uniformly.

Figure 5A:
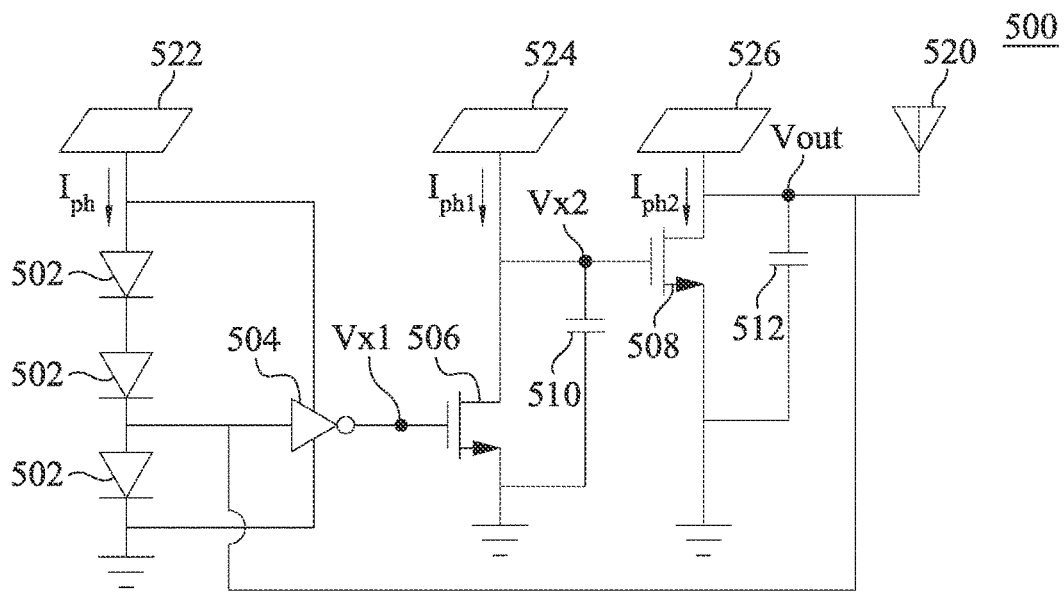
FIG. 5A illustrates a schematic circuit diagram of a sensing device, according to an embodiment.
Figure 6A:
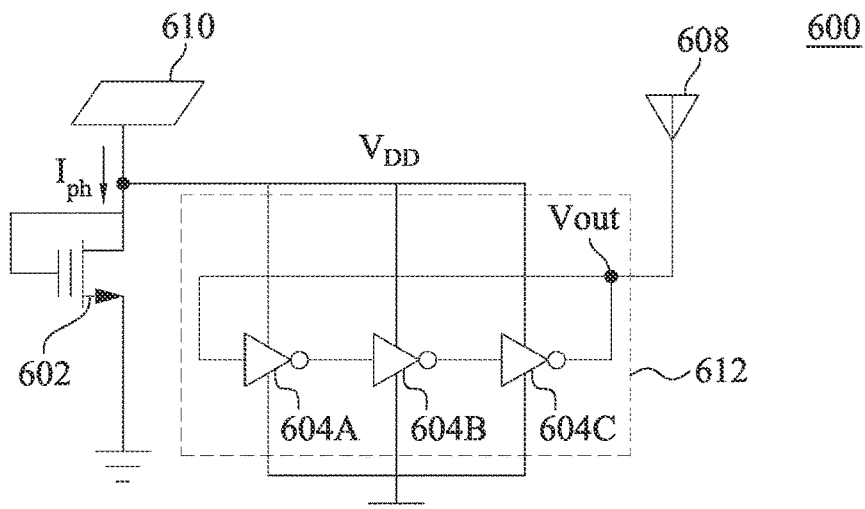
FIG. 6A illustrates a schematic circuit diagram of a sensing device, according to an embodiment.

Although not shown in FIG. 1A, the circuitry that is connected to the energy sensing pads on the chuck 104 can be connected to a wireless transmitter (see, for example, FIGS. 5A and 6A). The wireless transmitter can transmit the electrical signal wirelessly to a receiver that is being controlled by a user, and the user can determine whether the electrical signal, which corresponds to the intensity of the radiation at a predetermined portion of the chuck, is too high or too low. If the user determines that the level of the electrical signal is too low at the predetermined portion, the user can raise the intensity of the portion of the radiation source that corresponds to the predetermined portion to a desired or predetermined level. If the user determines that the level of the electrical signal is too high at the predetermined portion, the user can lower the intensity of the portion of the radiation source that corresponds to the predetermined portion to a desired or predetermined level.

Furthermore, the process of detecting and adjust the intensity of the radiation source can be automated. For example, a microcontroller or processor can detect the level of intensity of the radiation and determine whether the intensity falls within a predetermined range of intensity levels. If the level is outside the range, the microcontroller or processor can raise the intensity, if below the lower limit of the range, or lower the intensity, if greater than the higher limit of the range. This process can be repeated until the intensity is within the desired or predetermined range.

Figure 1B:
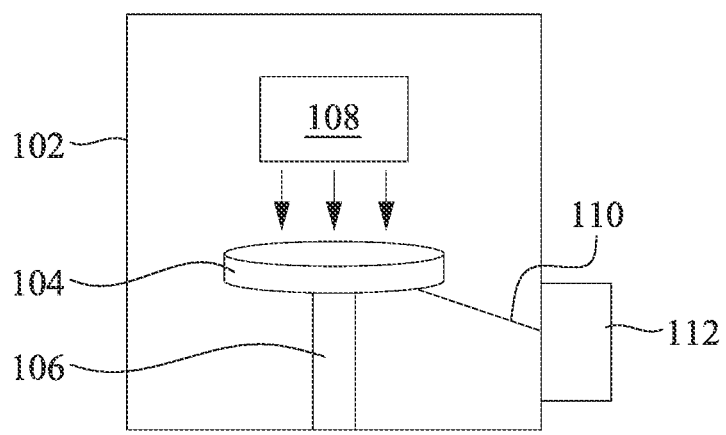

Referring to FIG. 1B, a semiconductor fabrication apparatus 100B is shown, in accordance with some embodiments. Similar to the semiconductor fabrication apparatus 100A of FIG. 1A, the semiconductor fabrication apparatus 100B includes a chamber 102, chuck 104, shaft 106, and radiation source 108. In addition, there is a wire 110 and a controller (e.g., microcontroller) 112.

The wire 110 can be connected to the circuitry (not shown) that converts the radiation intensity level to an electrical signal. The electrical signal can be detected at the controller 112 that is disposed outside of the chamber 102, and the user can adjust the intensity of the radiation source after determining that the electrical signal is too high or too low compared to a desired or predetermined level.

Figure 2A:
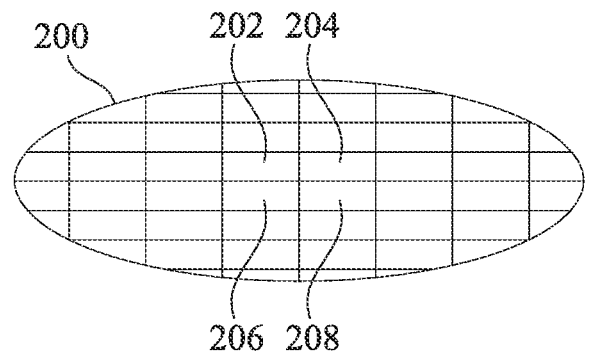
FIG. 2A illustrates a top view of a sensing device of a semiconductor fabrication apparatus, according to an embodiment.

Referring to FIG. 2A, a top view of a sensing device 200 of a semiconductor fabrication apparatus including energy sensing pads is shown, in accordance with some embodiments. The sensing device 200 can be formed in the chuck 104 described in FIGS. 1A-B. The sensing device 200 includes energy sensing pads (ESP) 202, 204, 206 and 208 that are adjacent to one another. Although FIG. 2A shows the sensing device 200 with a certain number of ESPs disposed on the chuck, the disclosed technology is not limited thereto, and there can be more or fewer ESPs on the chuck. Furthermore, although FIG. 2A shows that the ESPs have a rectangular or square shape, the disclosed technology is not limited thereto, and the ESPs can have any shape such as circular, triangular, hexagonal, etc. Also, the disclosed technology can work on a chuck 104 of any size or a wafer of any size.

The ESPs 202, 204, 206, and 208 can include a metal such as copper (Cu) or aluminum (Al) that is compatible with existing CMOS fabrication processes. The radiation source 108 can be argon fluoride (ArF) laser, ultraviolet (UV) light source, incoherent vacuum ultraviolet (VUV) light source, extreme ultraviolet (EUV) light source, deep ultraviolet (DUV) light source, electron beam (e-beam) source or any other suitable radiation source used to expose a wafer on the chuck 104 for lithography. Furthermore, although not shown, the ESPs can include a photoelectronic device such as a photodetector that converts radiation (e.g., optical signal, light or electron beam) into an electrical signal or current.

Figure 2B:
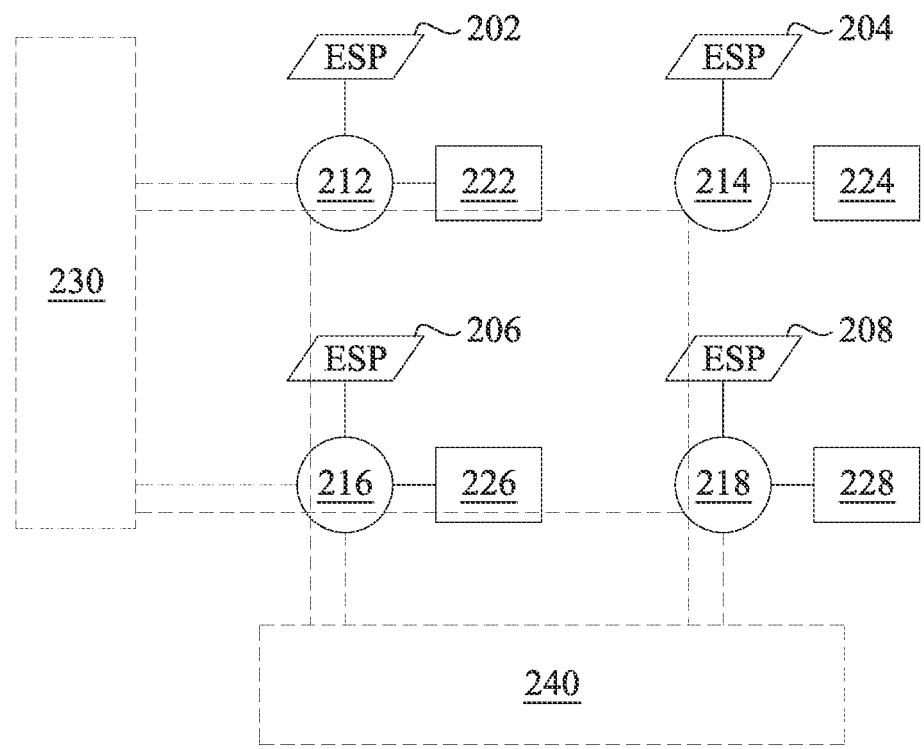
FIG. 2B illustrates a schematic circuit diagram of the sensing device of FIG. 2A, according to an embodiment.

Referring to FIG. 2B, a high-level schematic circuit diagram of the sensing device 200 is shown, in accordance with some embodiments. The diagram shows the ESPs 202-208 of FIG. 2A and the general circuitry that the ESPs 202, 204, 206, and 208 are connected to. As discussed with reference to FIG. 2A, although it is shown that there are only 4 ESPs and related circuitry, there can be more or fewer number of ESPs and their related circuitry.

The ESPs 202-208 can include a photodetector or any type of device that converts light, laser or any radiation type into an electrical signal. For example, each of the ESPs 202-208 can include a photodetector that converts light photons into an electrical current or voltage using a diode. The ESPs 202-208 including the photodetector can be respectively connected to circuits 212, 214, 216, and 218. The circuits 212-218 can respectively convert a current level or a voltage level that is output by the ESPs 202-208 and respectively output the current or voltage level to output nodes 222, 224, 226, and 228. The output nodes 222-228 can include a wireless transmitter as discussed above or be output to a controller 112, depending on the embodiment. Although not shown in detail, the circuits 212-218 may include a number of inputs and/or outputs and electronic devices such as transistors, wires, capacitors, etc.

Peripheral decoders 230 and 240 can be connected to the circuits 212-218. For example, the peripheral decoder 230 can be a row decoder, and the peripheral decoder 240 can be a column decoder. Referring to FIG. 2B, when the peripheral decoders 230 and 240 are connected to the ESPs 202-208, the controller 112 can detect the electrical signals that are output by all or a subset of the circuitry connected to the ESPs 202-208. For example, if the controller 112 detected that the intensity detected by the ESP 204 is less than a predetermined amount, the controller 112 can turn off the detection of ESPs 202, 206, and 208 and keep the detection of ESP 204 on so that the intensity detected at the ESP 204 can be adjusted. Although not shown, the outputs 222-228 can be connected to a plurality of bit lines that are connected to amplifiers that help detect the signal at the outputs 222-228. Furthermore, the radiation intensity detected at ESPs 202-208 can collectively determine an intensity profile of the radiation source 108.

Furthermore, one of the ESPs 202-208 and its associated circuits 212-218 and outputs 222-228, respectively, can sometimes be referred to as a pixel. The pixels can be arranged in a sensor array of rows and columns that are individually or collectively controlled using control signals from the controller 112.

Figure 3A:
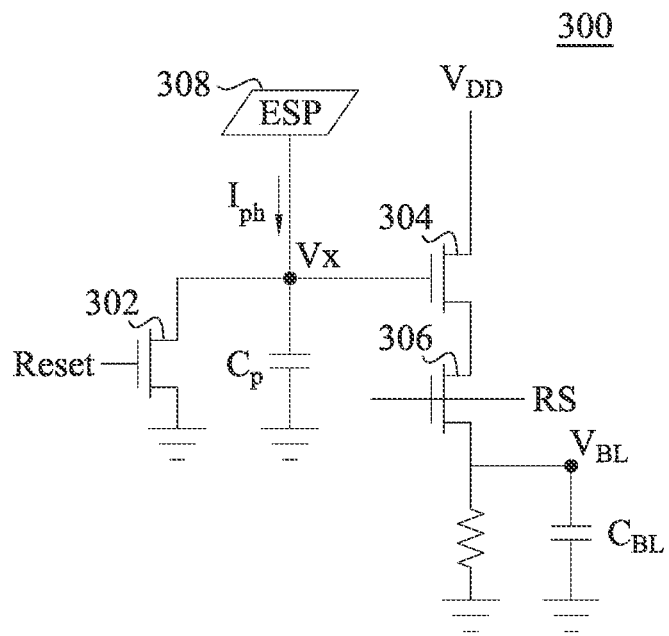
FIG. 3A illustrates a schematic circuit diagram of a sensing device, according to an embodiment.

Referring to FIG. 3A, a schematic circuit diagram of a sensing device 300 is shown, in accordance with some embodiments. The sensing device 300 can be a pixel in an array of pixels as shown in FIG. 2B. The sensing device 300 includes transistors 302, 304, and 306, an ESP 308 and capacitors Cp and CBL. Although a certain number of electronic devices are shown in FIG. 3A, the disclosed technology is not limited thereto. Further, although the transistors 302, 304, and 306 are shown to be n-type transistors, the transistors can be p-type (with the devices rearranged accordingly). Examples of the transistors 302, 304, and 306 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The sensing device 300 can be used for a radiation source 108 such as a UV light source, VUV light source, EUV light source or a DUV light source.

Transistor 302 has a first terminal connected to an electrical ground and a second terminal connected to the ESP 308, node Vx, a capacitor Cp, and transistor 304. The transistor 302 also has a gate terminal connected to a Reset signal line which can be output from the controller 112 (FIG. 1B). The transistor 302 can function as a reset transistor. In other words, when the Reset signal is set to a high level, the transistor 302 turns on and any lingering charges that were held at capacitor Cp or ESP 308 are dissipated to the electrical ground through transistor 302. This intentional dissipation helps ensure that the measurement of the intensity of the radiation is accurate.

Transistor 304 has a first terminal connected to transistor 306, a second terminal connected to power supply VDD and a gate terminal connected to the node Vx which is connected to the ESP 308, the transistor 302, and capacitor Cp. The transistor 304 turns on when the voltage of the node Vx reaches a turn-on voltage.

Transistor 306 has a first terminal connected to node VBL, a second terminal connected to the first terminal of transistor 304, and a gate terminal connected to the control line RS. Transistor 306 functions like a control transistor. In other words, when the voltage of the control line RS is set to the turn-on voltage, the transistor 306 also turns on, if the transistor 304 is also turned on. In other words, the current that flows through transistor 304 also flows through transistor 306.

The ESP 308 can be any of the ESPs 202-208 of FIGS. 2A and 2B. When ESP 308 is exposed to radiation, a current Iph is generated that flows away from ESP 308 toward capacitor Cp. The current Iph in FIG. 3A is a charging current. In other words, the current Iph charges the capacitor Cp. Over time, the capacitor Cp gets charged up such that the voltage level at the node Vx increases and turns on the transistor 304. When the transistor 306 is turned on, the voltage level at node VBL also increases, charging up capacitor CBL. Accordingly, when the ESP 308 is exposed to radiation, the current Iph is generated and flows to the capacitor Cp. The strength of the current Iph is directly dependent on, or substantially directly proportional to, the intensity of the radiation that the ESP 308 is exposed to. As the capacitor Cp gets charged up, the transistor 304 turns on, and the amount of current that flows from power supply VDD to the node VBL and into capacitor CBL is substantially directly proportional to the intensity of the radiation that the ESP 308 is exposed to. Accordingly, a measurement of the voltage at the node VBL is indicative of the radiation intensity at the ESP 308.

The sensing device 300 can be a pixel in an array of pixels as shown in FIG. 2B. The pixels can individually detect the intensity of the radiation at each of the ESPs in the pixels. Referring to FIG. 3A, the pixels can be read out by the control signal RS that is set by a controller such as controller 112. In other words, in an array with rows and columns, each pixel in a row can be read out on a bit line that is connected to the node VBL. Each of the bit lines can be connected to an amplifier that is output to the peripheral decoder 230 like a column decoder, and the output can be sent by a wire such as wire 110 to the controller 112. Each row of the pixels can be read out sequentially such that a profile of the entire chuck 104 can be detected. This can help adjusting regions of pixels at a time.

Figure 3B:
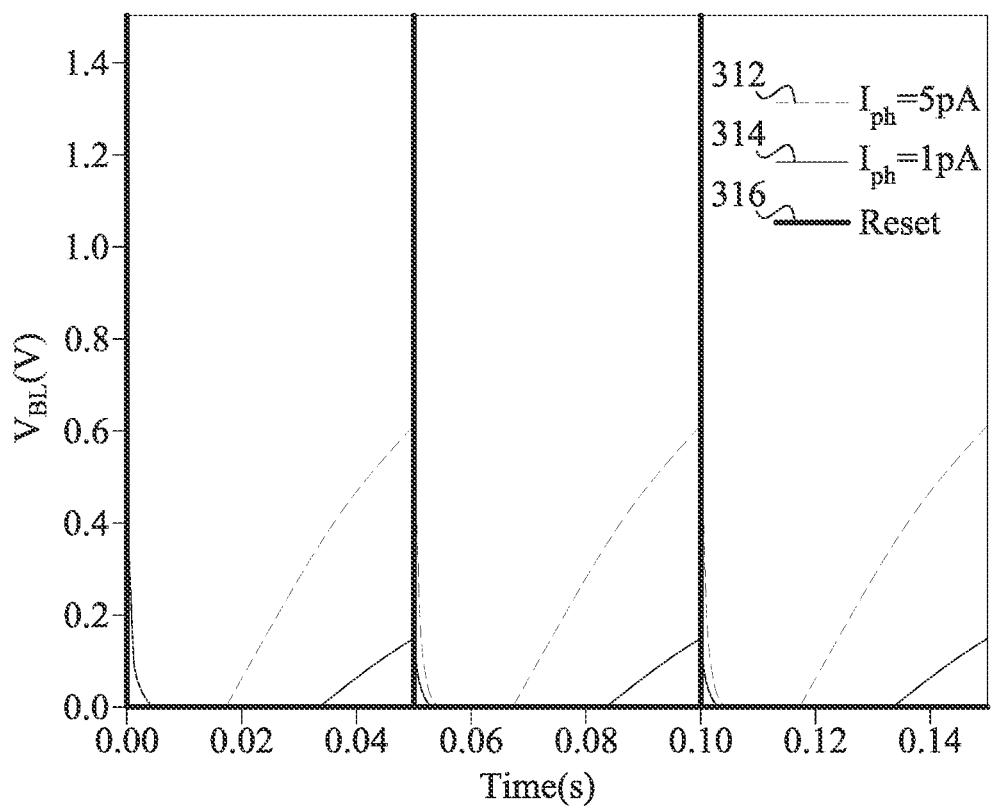
FIG. 3B illustrates a waveform graph of voltages at the output of the sensing device of FIG. 3A, according to an embodiment.

Referring to FIG. 3B, a waveform graph of the sensing device 300 of FIG. 3A is shown, in accordance with some embodiments. The x-axis is time in seconds, and the y-axis is the voltage at node VBL. Reset line 316 shows when a turn-on voltage is set on the Reset line that turns on the transistor 302. Two other lines are shown: one is line 312 which is a measurement of the node VBL when the current Iph is about 5 pA, and another is line 314 which is a measurement of the node VBL when the current Iph is about 1 pA. However, the current levels at Iph are not limited thereto, and the current levels can be lower or higher than either of these current levels. Also, although specific units and values are shown, the disclosed technology is not limited thereto. For example, the time at which the reset signal is set to the turn-on voltage (0.00 s, 0.05 s, 0.10 s, etc.) does not have to be 0.05 s intervals. In some embodiments, the interval may be shorter or longer than 0.05 s, and in some embodiments, there may not be a regular interval. In other words, the user may choose to set the reset signal to have the turn-on voltage so that the VBL measurement may be made on demand.

At time 0.00 s, the reset signal on the Reset line that is connected to the gate terminal of transistor 302 (FIG. 3A) is set to a turn-on voltage to turn on transistor 302. When the transistor 302 is turned on, the electrons that were built up at both the ESP 308 and the capacitor Cp are flushed out to the electrical ground. Although not shown, the voltage at the control line RS can also be set to the turn-on voltage so that the transistor 306 can transfer the current generated through transistor 304 to the node VBL and capacitor CBL. After the reset stage is complete, the reset signal can be set back to the turn-off voltage.

After the reset signal is set to turn-off voltage, and the transistor 302 is turned off, the current Iph starts flowing to the capacitor Cp. The current Iph is generated as a result of the radiation received at the ESP 308 being converted into the current Iph. As discussed above, the line 312 corresponds to a voltage level measured at VBL when the current Iph is 5 pA, and the line 314 corresponds to a voltage level measured at VBL when the current Iph is 1 pA. As the capacitor Cp begins to build charges, the voltage level at node Vx increases, and eventually the gate terminal of the transistor 304 is set to the turn-on voltage. Then the transistor 304 is turned on so that a current flows through the transistors 304 and 306.

At about 0.018 s, for line 312, the voltage level at VBL starts increasing because charges are building up at the capacitor CBL. At about 0.035 s, for line 314, the voltage level at VBL starts increasing. Accordingly, the voltage level that gets measured at node VBL is dependent on the current Iph which is dependent on how much radiation the ESP 308 is exposed to. When determining whether the intensity of the radiation exposure at the ESP 308 is the correct or desired amount, the user can compare the line 312 or the line 314 against a predetermined waveform. For example, the predetermined waveform can have a certain slope or a range of slopes that is acceptable. And the user can determine that the slope on line 312 or line 314 is too low compared to the predetermined waveform, in which case the intensity of the radiation is too low and raise the intensity of the radiation source. Or if the slope on the line 312 or line 314 is high compared to the predetermined waveform, the user can determine that the intensity is too strong and lower the intensity of the radiation source. As another example, the predetermined waveform can have a voltage level or a range of voltage levels that are acceptable, and when the waveform is outside that range, the user can adjust the intensity level of the radiation source. Accordingly, the next wafer that is placed on the chuck 104 can be exposed to a more uniform level of radiation with the desired intensity.

Figure 4A:
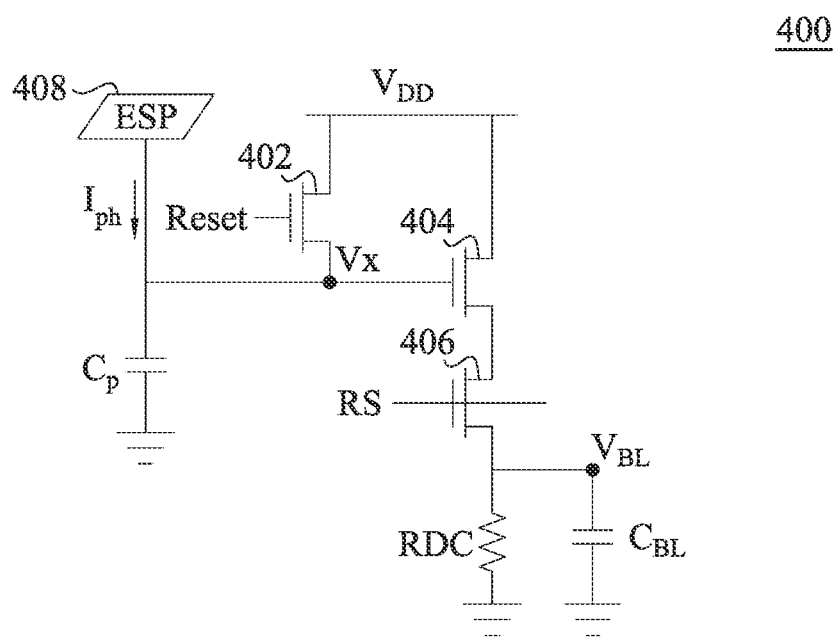
FIG. 4A illustrates a schematic circuit diagram of a sensing device, according to an embodiment.

Referring to FIG. 4A, a schematic circuit diagram of a sensing device 400 is shown, in accordance with some embodiments. The sensing device 400 can be a pixel in an array of pixels as shown in FIG. 2B. The sensing device 400 includes transistors 402, 404, and 406, an ESP 408, resistor RDC, and capacitors Cp and CBL. Although a certain number of electronic devices are shown in FIG. 4A, the disclosed technology is not limited thereto. Further, although the transistors 402, 404, and 406 are shown to be n-type transistors, the transistors can be p-type (with the devices rearranged accordingly). Examples of the transistors 402, 404, and 406 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The sensing device 400 can be used for a radiation source 108 such as an e-beam source.

Transistor 402 has a first terminal connected to node Vx which is connected to the ESP 408, capacitor Cp, and the transistor 404. The transistor 402 has a second terminal connected to the power supply VDD and a gate terminal connected to a Reset signal line which can be output from the controller 112 (FIG. 1B). The transistor 402 can function as a reset transistor. In other words, when the Reset signal is set to a high level, the transistor 402 turns on and charges the capacitor Cp. This intentional charging helps ensure that the measurement of the intensity of the radiation is accurate.

Transistor 404 has a first terminal connected to transistor 406, a second terminal connected to power supply VDD and a gate terminal connected to the node Vx which is connected to the ESP 408, the transistor 402, and capacitor Cp. The transistor 404 turns on when the voltage of the node Vx reaches a turn-on voltage.

Transistor 406 has a first terminal connected to node VBL, a second terminal connected to the first terminal of transistor 404, and a gate terminal connected to the control line RS. Transistor 406 functions like a control transistor. In other words, when the voltage of the control line RS is set to the turn-on voltage, the transistor 406 turns on, if the transistor 404 is also turned on. In other words the current that flows through transistor 404 also flows through transistor 406.

When the transistor 406 is turned on, the node VBL gets pulled up and charges the CBL. In other words, when the Reset signal and RS signal are set to a turn-on voltage, a charging current flows from VDD through the transistors 404 and 406 and charges up CBL. So when the sensing device 400 is reset, the capacitor CBL is charged up and VBL is set to a high voltage.

The ESP 408 can be any of the ESPs 202-208 of FIGS. 2A and 2B. When ESP 408 is exposed to an e-beam, the current Iph is generated that flows away from the capacitor toward the ESP 408. Over time, the capacitor Cp gets discharged such that the voltage level at the node Vx decreases and turns off the transistor 404. When the transistor 406 is turned off, the voltage level at node VBL also decreases, discharging the capacitor CBL through resistor RDC. Accordingly, when the ESP 408 is exposed to radiation, the current Iph is generated and flows to the capacitor Cp. The strength of the current Iph is directly dependent on, or substantially inversely proportional to, the intensity of the radiation that the ESP 408 is exposed to. As the capacitor Cp gets discharged, the transistor 404 turns off, and the capacitor CBL discharges at a rate that is substantially inversely proportional to the intensity of the radiation that the ESP 408 is exposed to. Accordingly, a measurement of the voltage at the node VBL is indicative of the radiation intensity at the ESP 408.

The pixels can individually detect the intensity of the radiation at each of the ESPs in the pixels. Referring to FIG. 4A, the pixels can be read out by the control signal RS that is set by a controller such as controller 112. In other words, in an array with rows and columns, each pixel in a row can be read out on a bit line that is connected to the node VBL. Each of the bit lines can be connected to an amplifier that is output to the peripheral decoder 230 like a column decoder, and the output can be sent by a wire such as wire 110 to the controller 112. Each row of the pixels can be read out sequentially such that a profile of the entire chuck 104 can be detected. This can help adjusting regions of pixels at a time. However, unlike the control signal that has to be set to a turn-on voltage on the control line RS in the sensing device 300 in order to sense the voltage level at the VBL, the control signal in the sensing device 400 has to be set to a turn-off voltage. In other words, the control signal on the control line RS has to be set to a turn-off voltage so that the node VBL is electrically disconnected from the power supply VDD. And the rate of the capacitor CBL discharging is measured in order to determine the intensity of the radiation.

Figure 4B:
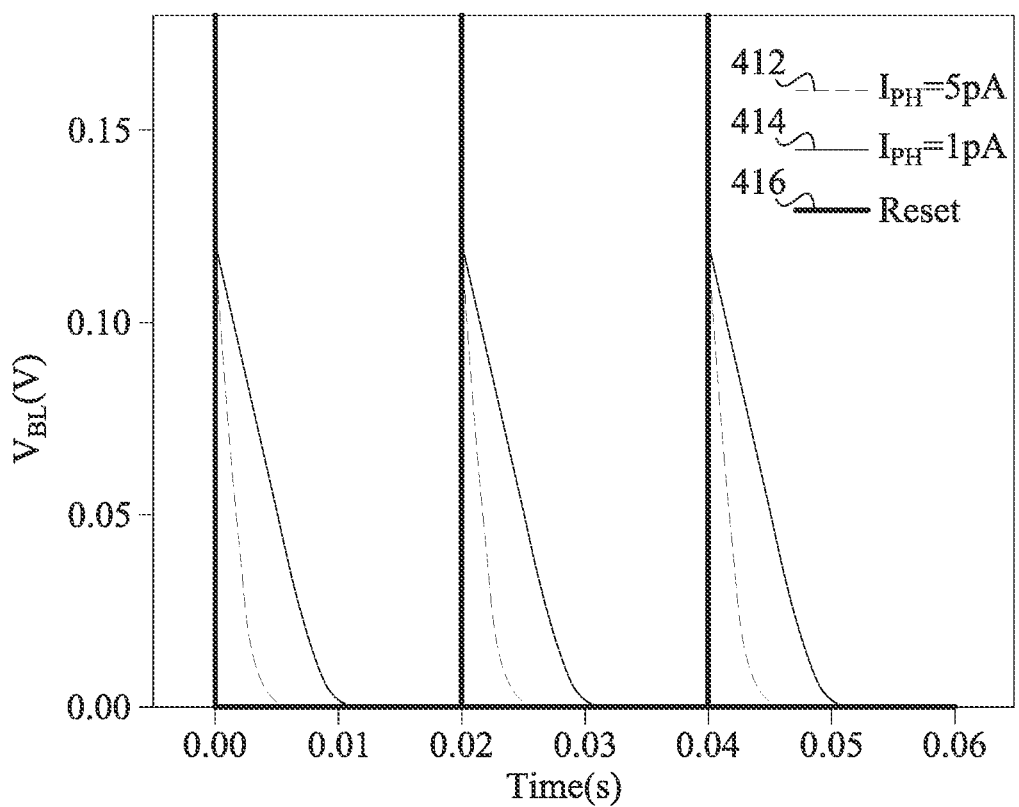
FIG. 4B illustrates a waveform graph of voltages at the output of the sensing device of FIG. 4A, according to an embodiment.

Referring to FIG. 4B, a waveform graph of the sensing device 400 of FIG. 4A is shown, in accordance with some embodiments. The x-axis is time in seconds, and the y-axis is the voltage at node VBL. Reset line 416 shows when a turn-on voltage is set on the Reset line that turns on the transistor 402. Two other lines are shown: one is line 412 which is a measurement of the node VBL when the current Iph is about 5 pA, and another is line 414 which is a measurement of the node VBL when the current Iph is about 1 pA. However, the current levels at Iph are not limited thereto, and the current levels can be lower or higher than either of these current levels. Also, although specific units and values are shown, the disclosed technology is not limited thereto. For example, the time at which the reset signal is set to the turn-on voltage (0.00 s, 0.05 s, 0.10 s, etc.) does not have to be 0.05 s intervals. In some embodiments, the interval may be shorter or longer than 0.05 s, and in some embodiments, there may not be a regular interval. In other words, the user may choose to set the reset signal to have the turn-on voltage so that the VBL measurement may be made on demand.

At time 0.00 s, the reset signal on the Reset line that is connected to the gate terminal of transistor 402 (FIG. 4A) is set to a turn-on voltage to turn on transistor 402. When the transistor 402 is turned on, the capacitor Cp is charged up. Furthermore, the voltage at the control line RS can also be set to the turn-on voltage so that the transistor 406 can transfer the current generated through transistor 404 to the node VBL and capacitor CBL so that the capacitor CBL is charged up. After the reset stage is complete, the reset signal can be set back to the turn-off voltage. The transistors 404 and 406 are left turned on.

After the reset signal is set to turn-off voltage, and the transistor 402 is turned off, the current Iph, which is a discharging current, starts flowing to the capacitor Cp. The current Iph is generated as a result of the radiation received at the ESP 408 being converted into the current Iph. As discussed above, the line 412 corresponds to a voltage level measured at VBL when the current Iph is 5 pA, and the line 414 corresponds to a voltage level measured at VBL when the current Iph is 1 pA. As the capacitor Cp begins to discharge, the voltage level at node Vx decreases, and eventually the gate terminal of the transistor 404 is set to the turn-off voltage. Then the transistor 404 is turned off so that a current no longer flows through the transistors 404 and 406.

As time progresses, for line 412, the voltage level at VBL starts decreasing because the charge that was built up at the capacitor CBL. For line 414 the voltage level at VBL starts decreasing at a faster rate than the line 412. The slope or rate for line 414 is greater than the line 412 because the discharging current strength of the current Iph at 5 pA is greater than the current at 1 pA. Therefore, the transistor 404 will turn off quicker with Iph of 5 pA than with Iph of 1 pA. Accordingly, the voltage level that gets measured at node VBL is dependent on the current Iph which is dependent on how much radiation the ESP 408 is exposed to. When determining whether the intensity of the radiation exposure at the ESP 408 is the correct or desired amount, the user can compare the line 412 or the line 414 against a predetermined waveform. For example, the predetermined waveform can have a certain slope or a range of slopes that is acceptable. And the user can determine that the slope on line 412 or line 414 is too low compared to the predetermined waveform, in which case the intensity of the radiation is too low and raise the intensity of the radiation source. Or if the slope on the line 412 or line 414 is high compared to the predetermined waveform, the user can determine that the intensity is too strong and lower the intensity of the radiation source. As another example, the predetermined waveform can have a voltage level or a range of voltage levels that are acceptable, and when the waveform is outside that range, the user can adjust the intensity level of the radiation source. Accordingly, the next wafer that is placed on the chuck 104 can be exposed to a more uniform level of radiation with the desired intensity.

Unlike the waveforms shown in FIG. 3B for the sensing device 300, the waveforms in FIG. 4B show the voltage level at the node VBL decreasing because the capacitor CBL is discharging. And the rate at which the voltage level decreases is inversely proportional, or substantially inversely proportional, to the intensity of the radiation that the ESP 408 is exposed to.

Referring to FIG. 5A, a schematic circuit diagram of a sensing device 500 is shown, in accordance with some embodiments. The sensing device 500 can be a pixel in an array of pixels as shown in FIG. 2B. The sensing device 500 includes diodes 502, inverter 504, transistors 506 and 508, capacitors 510 and 512, nodes Vx1, Vx2, and Vout, wireless transmitter 520, energy pad (EP) 522, and ESPs 524 and 526. Although a certain number of electronic devices are shown in FIG. 5A, the disclosed technology is not limited thereto. Further, although the transistors 506 and 508 are shown to be n-type transistors, the transistors can be p-type (with corresponding rearrangement of the devices). Examples of the transistors 506 and 508 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The sensing device 500 can be used for a radiation source 108 such as a UV light source, VUV light source, EUV light source or a DUV light source.

The ESP 524 and ESP 526 can be two adjacent pixels on the chuck 104. However, the ESP 524 and ESP 526 can be pixels that are not adjacent to each other, and there can be other pixels that are formed therebetween. In other words, the sensing device 500 can detect the radiation intensity at two adjacent or non-adjacent pixels. And depending on the waveforms that get generated, the user can determine whether the radiation intensity at the ESP 524 or the ESP 526 or both are too high or too low.

The diodes 502 are serially connected to the EP 522 which absorbs the radiation from the radiation source 108. The diodes 502 are powered by the radiation, thereby allowing sensing device 500 to be self-powered without the need for an external power supply like power supply VDD in sensing devices 300 and 400. Further, although three diodes 502 are shown in FIG. 5A, embodiments are not limited thereto and there can be more or fewer diodes in series. A current Iph flows through the diodes 502 and to the inverter 504.

An input of the inverter 504 is connected to an output of one of the diodes 502 and the node Vout which is connected to the capacitor 512. Because the input of the inverter 504 is connected to the capacitor 512, it is able to track the voltage level at node Vout as capacitor 512 is charged and discharged. This effect will be explained in greater detail below. The output of the inverter 504 is node Vx1. This node is measured and shown in FIG. 5B.

The transistor 506 has a first terminal connected to the electrical ground, a second terminal connected to the ESP 524, and a gate terminal connected to the node Vx1 which is connected to the output of the inverter 504. As the input of the inverter 504 (at node Vout) changes between a high voltage and a low voltage, the output of the inverter (at node Vx1) changes between a low voltage and a high voltage, respectively. As the voltage at the node Vx1 reaches a turn-on voltage, the transistor 506 turns on which discharges the capacitor 510 (at node Vx2). When the voltage at the node Vx1 is below the turn-on voltage, the transistor 506 turns off, and the capacitor 510 is charged by the current Iph1 that gets generated by the radiation that ESP 524 is exposed to.

The transistor 508 has a first terminal connected to the electrical ground. The transistor 508 has a second terminal connected to the ESP 526, the capacitor node Vout and the wireless transmitter 520. The transistor also has a gate terminal connected to node Vx2, the capacitor 510, and the second terminal of the transistor 506. As discussed above, the voltage level at the node Vx2 changes as the capacitor 510 gets charged or discharged. The changing voltage level at node Vx2 also changes whether the transistor 508 is turned on or off. For example, when the node Vx2 is at a turn-on voltage, the transistor 508 is turned on, and the charge on the capacitor 512 is discharged through the transistor 508. When the node Vx2 is below the turn-on voltage, the transistor 508 is turned off, and the capacitor 512 is charged by converting the radiation at the ESP 526 to the current Iph2. Accordingly, as the capacitor 510 gets charged and discharged, the capacitor 512 is discharged and charged, respectively, depending on whether the transistor 508 is turned on or off. The node Vout, which is also connected to the input of the inverter 504, oscillates between high and low voltages.

The wireless transmitter 520 can include an antenna that transmits the level of the voltage at node Vout. A receiver (not shown) can receive the wireless signal from the wireless transmitter 520. The receiver can be connected to a controller (not shown) that can determine whether the voltage level or the rate at which the voltage level at the node Vout changes is sufficiently high or low.

Figure 5B:
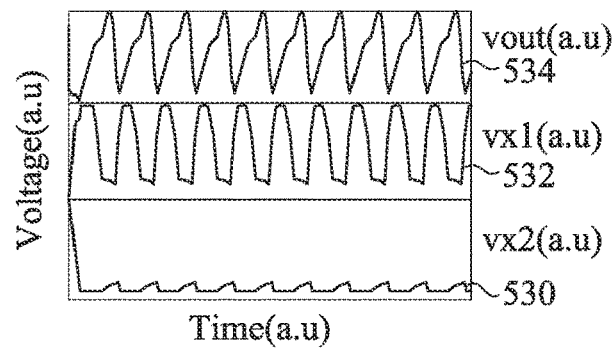
FIG. 5B illustrates a waveform graph of voltages at different nodes of the sensing device of FIG. 5A, according to an embodiment.

Referring to FIG. 5B, a waveform graph of the sensing device 500 of FIG. 5A is shown, in accordance with some embodiments. The graph shows three different waveforms: lines 530, 532 and 534. The line 530 is the voltage level measured at node Vx2, the line 532 is the voltage level measured at node Vx1, and the line 534 is the voltage level measured at node Vout. For clarity, the three lines are stacked on top of each other. Although the voltage levels at nodes Vx1, Vx2, and Vout are shown to have certain slopes and values, the disclosed technology is not limited thereto. In other words, depending on what the user intends to set as the intensity level of the radiation, the slopes or values of the voltage levels can be different.

As discussed above, the line 532, which measures the voltage level at the node Vx1, tracks the output of the inverter 504 and the input of the gate terminal of the transistor 506. The line 530 which measures the voltage level at the node Vx2, tracks the voltage of the capacitor 510. As the voltage level at node Vx1 increases and passes the threshold voltage (or turn-on voltage) of the transistor 506, the voltage level at node Vx2 decreases because the charges that were built up at the capacitor 510 gets discharged through the transistor 506 to the electrical ground. And when the voltage level at node Vx1 decreases below the turn-on voltage of the transistor 506, the transistor 506 turns off and the current Iph1 that is generated based on the radiation at the ESP 524 flows to the capacitor 510, building up the charges again. Therefore, the voltage level at Vx2 increases. Accordingly, the line 530 forms a wave as the capacitor 510 gets discharged and charged. The rate at which the discharge occurs and the rate at which the charging occurs, as tracked at node Vx2, are indicative of the intensity level of the radiation at ESP 524.

Line 534 is the voltage level at the node Vout, which tracks the output of the transistor 508 and the charge level at the capacitor 512. As the voltage level at the node Vx2 increases and passes the threshold voltage (or turn-on voltage) of the transistor 508, the voltage level at Vout decreases because the charge that was built up at the capacitor 510 gets discharged through the transistor 508 to the electrical ground. When the voltage level of the node Vx2 drops below the turn-on voltage of the transistor 508 because the charges at the capacitor 510 is being discharged, the transistor 508 turns off, and the capacitor 512 gets charged up by the current Iph2 that gets generated based on the ESP 526 and the voltage level at Vout increases. Accordingly, the line 534 forms a wave as the capacitor 512 gets discharged and charged. The rate at which the capacitor 512 is charged and discharged is indicative of the intensity level of the radiation at ESP 526 as well as the radiation level at ESP 524, since the transistor 508 is turned on and off based on the input which is the node Vx2, which tracks the intensity of the radiation at ESP 524. Accordingly, the intensity level of the radiation at ESP 524 and the intensity level of the radiation at ESP 526 can be measured by the waveform that is formed at node Vout.

Figure 5C:
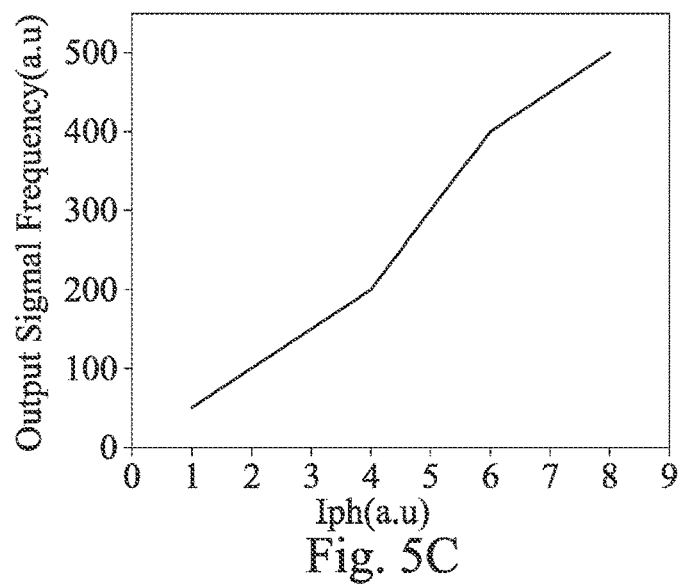
FIG. 5C illustrates a waveform graph of an output signal frequency at the output of the sensing device of FIG. 5A, according to an embodiment.

Referring to FIG. 5C, an output frequency graph of the sensing device 500 of FIG. 5A is shown, in accordance with some embodiments. The x-axis is the value of the current Iph (or Iph1 or Iph 2) and the y-axis is the output frequency at node Vout. As the current level increases, the output frequency also increases. For example, the output frequency at node Vout is directly proportional, or substantially directly proportional, to the current level of current Iph. Although the output frequency at node Vout is shown to have certain slopes and values, the disclosed technology is not limited thereto. In other words, depending on what the user intends to set as the intensity level of the radiation, the slope or value of the output frequency can be different.

Referring to FIG. 6A, a schematic circuit diagram of a sensing device 600 is shown, in accordance with some embodiments. The sensing device 600 can be a pixel in an array of pixels as shown in FIG. 2B. The sensing device 600 can be used for a radiation source 108 such as a UV light source, VUV light source, EUV light source or a DUV light source. The sensing device 600 includes a transistor 602, a ring oscillator 612 with inverters 604A, 604B, and 604C, a node Vout, a wireless transmitter 608, and node VDD. Although a certain number of electronic devices are shown in FIG. 6A, the disclosed technology is not limited thereto.

Further, although the transistor 602 is shown to be an n-type transistor, the transistor can be p-type (with corresponding rearrangement of the devices). Examples of the transistor 602 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

The transistor 602 has a first terminal connected to the electrical ground and a second terminal connected to the ESP 610 and node VDD. The second terminal is also connected to the transistor 602's gate electrode so that it is always turned on, whenever the voltage at the ESP 610 is greater than the turn-on voltage of the transistor 602.

The ring oscillator 612 includes the inverters 604A-604C. Although the number of inverters in FIG. 6A is 3, there can be more than 3 inverters, as long as there is an odd number of inverters to form a ring oscillator. Each of inverters 604A-604C is powered by the voltage at node VDD. Therefore, the output of the ring oscillator 612 at node Vout is dependent on the voltage at VDD, which is dependent on the radiation at the ESP 610.

The wireless transmitter 608 can include an antenna that transmits the level of the voltage at node Vout. A receiver (not shown) can receive the wireless signal from the wireless transmitter 608. The receiver can be connected to a controller (not shown) that can determine whether the voltage level or the rate at which the voltage level at the node Vout changes is sufficiently high or low.

If the voltage at node VDD is high, the power supply of the inverters 604A-604C are also high, which increases the rate at which the output of the inverters switch. Accordingly, the output of the ring oscillator at node Vout is going to switch between high and low faster as the voltage at node VDD increases. The user who is monitoring the intensity level at ESP 610 can compare the output waveform of the voltage level at node Vout to a predetermined waveform and determine whether the intensity level of the radiation at ESP 610 is too high or too low. For example, if the switching speed is too fast compared to the predetermined switching speed (or greater than the acceptable range of switching speeds), the user can lower the intensity of the radiation at the radiation source 108 such that the radiation at ESP 610 is decreased. And if the switching speed is too slow compared to the predetermined switching speed (or below the acceptable range of switching speeds), the user can raise the intensity of the radiation at the radiation source 108 such that the radiation at ESP 610 is increased.

Figure 6B:
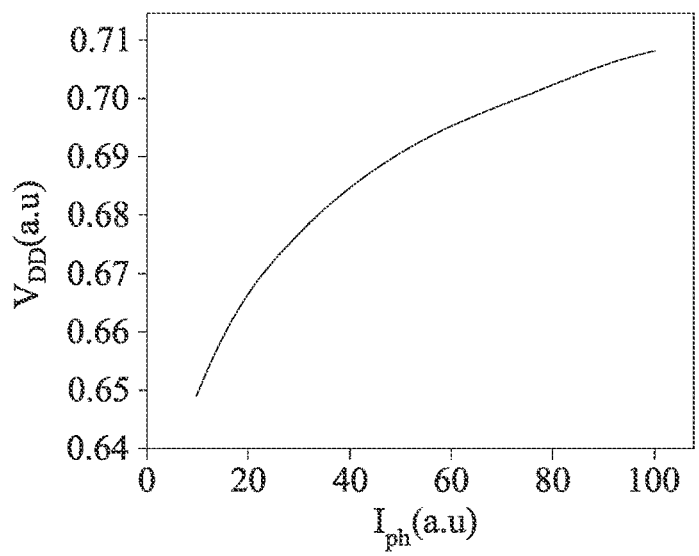
FIG. 6B illustrates a waveform graph of a voltage at the output of the sensing device of FIG. 6A, according to an embodiment.

Referring to FIG. 6B, an output voltage graph of the sensing device 600 of FIG. 6A is shown, in accordance with some embodiments. The x-axis is the current Iph, and the y-axis is the voltage at node VDD. The term "a.u" means that arbitrary units, which means the numbers shown on the x-axis and y-axis. Although the voltage level at node VDD is shown to have a certain slope and values, the disclosed technology is not limited thereto. In other words, depending on what the user intends to set as the intensity level of the radiation, the slope or value of the voltage level can be different.

The ESP 610 can convert the radiation at the ESP 610 into the current Iph. Accordingly, the voltage at the node VDD is dependent on how much radiation the ESP 610 receives. As the current Iph increases, the voltage at VDD also increases.

Figure 6C:
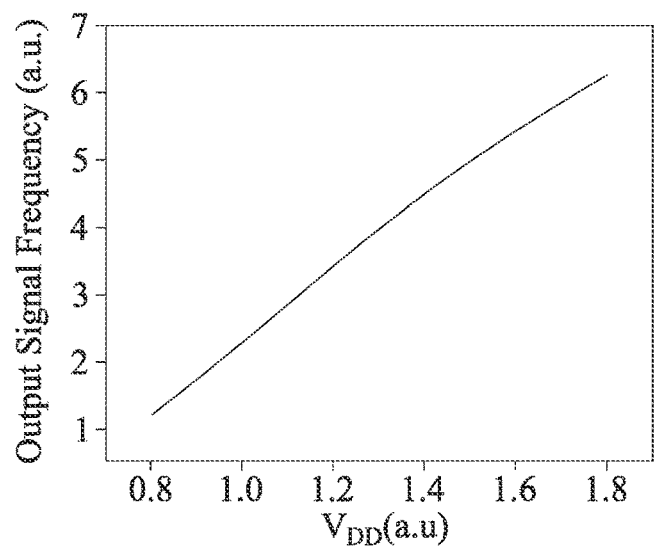
FIG. 6C illustrates a waveform graph of an output frequency at the output of the sensing device of FIG. 6A, according to an embodiment.

Referring to FIG. 6C, an output frequency graph of the sensing device 600 of FIG. 6A is shown, in accordance with some embodiments. The x-axis is the voltage level at node VDD and the y-axis is the output frequency (or output signal frequency) at the node Vout. Although the output frequency is shown to have a certain slope and values, the disclosed technology is not limited thereto. In other words, depending on what the user intends to set as the intensity level of the radiation, the slope or value of the output frequency can be different.

As discussed above, the voltage level at the node VDD can increase as the ESP 610 is exposed to more radiation. The increase in exposure at ESP 610 also increases the voltage level at the node VDD, and the increase of the voltage level at node VDD also increases the power supply for the ring oscillator 612 and the inverters 604A-604C. This increase in the power supply also increases the switching speeds of the inverters 604A-604C, which also increases the output frequency at the node Vout, which is the output of the ring oscillator 612. Accordingly, intensity level of the radiation at the ESP 610 increases the output frequency at the node Vout. And the output signal frequency waveform can be compared to a predetermined waveform to determine whether the intensity of the radiation needs to be adjusted. For example, if the slope of the output frequency graph is too high compared to a predetermined slope or a predetermined range of slopes, the intensity can be adjusted to be lower so that the output frequency is substantially the same as the predetermined slope or within the predetermined range of slopes. As another example, if the slope of the output frequency is too low, the intensity can be adjusted to be greater so that the output frequency is substantially the same as the predetermined slope or within the predetermined range of slopes. Accordingly, the output frequency is substantially proportional to the intensity of the radiation at the ESP 610.

Figure 7:
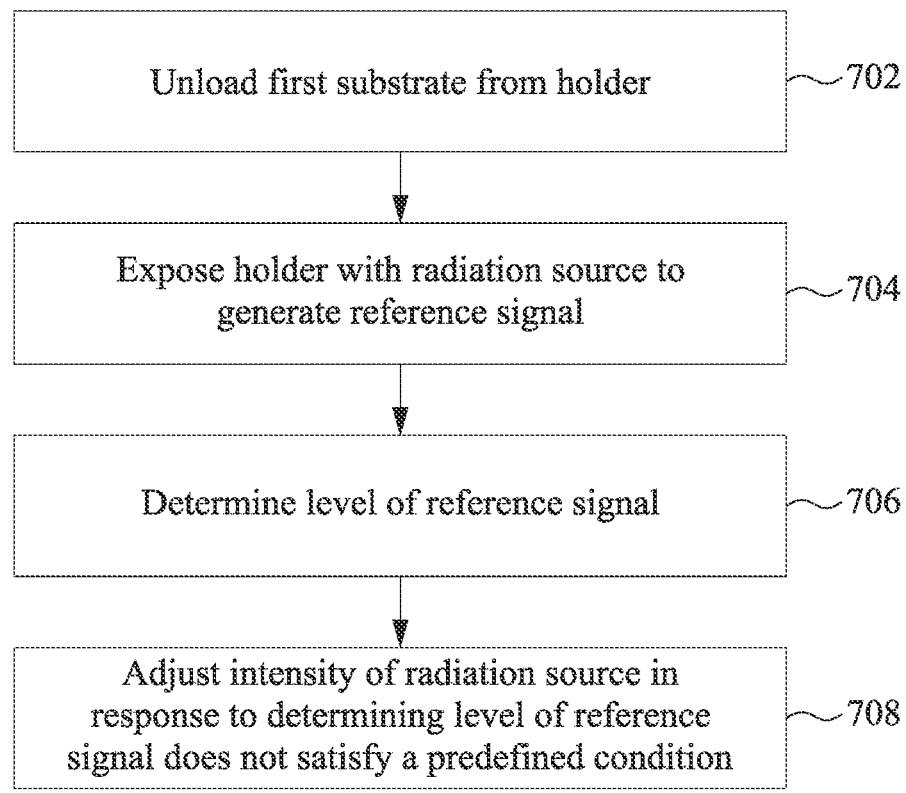
FIG. 7 illustrates a flow chart of an example method of using the semiconductor fabrication apparatus, according to an embodiment.

FIG. 7 illustrates a flow chart of an example method of using the semiconductor fabrication apparatus, according to an embodiment. It should be noted that process 700 is merely an example and is not intended to limit the present disclosure. Accordingly, it is understood that additional steps/operations may be provided before, during, and after process 700 of FIG. 7, and that some other operations may only be briefly described herein.

In brief overview, the process 700 starts with operation 702 of unloading a first substrate from the holder. Then, the process 700 can proceed to operation 704 of exposing the holder with a radiation source to generate a reference signal. Then, the process 700 can proceed to operation 706 of determining the level of the reference signal. Then, the process 700 can proceed to operation 708 of adjusting the intensity of the radiation source in response to determining that the level of reference signal does not satisfy a predefined condition.

Operation 702 includes unloading a first substrate from the holder (or chuck 104). The operation 702 happens after the first substrate was exposed to radiation such as EUV light or e-beam, or any of the radiation sources as discussed above. In other words, the following operations may occur when no substrate is present on the holder, or before the next substrate is loaded on the holder.

Operation 704 includes exposing the holder with the radiation source to generate a reference signal. The reference signal can be, for example, the voltage level at node VBL in sensing device 300 (FIGS. 3A-3B), the voltage level at node VBL in sensing device 400 (FIGS. 4A-4B), the voltage levels at nodes Vx1, Vx2, or Vout of sensing device 500

(FIGS. 5A-5B), the output frequency at node Vout of sensing device 500 (FIGS. 5A, 5C), the voltage level at node VDD of sensing device 600 (FIGS. 6A-6B), or the output frequency at node Vout of sensing device 600 (FIGS. 6A, 6C).

Operation 706 includes determining the level of the reference signal. As discussed with respect to each of the sensing devices 400, 500, 600, and the process 700, the reference signal is substantially directly proportional or inversely (or negatively) proportional to the intensity of the radiation. Therefore, the reference signal can be used to determine whether the radiation intensity is sufficient to achieve uniformity of the exposure for the whole wafer.

Operation 708 includes adjusting the intensity of the radiation source 108 in response to determining that the level of reference signal does not satisfy a predefined condition (e.g., predetermined slope or value or predetermined ranges of slopes or values). In other words, if the level of the reference signal is below the predefined level, the intensity of the corresponding portion of the radiation source can be adjusted to be greater. If the level of the reference signal is greater than the predefined level, the intensity of the corresponding portion of the radiation source can be adjusted to be lower. Accordingly, the radiation source as a whole or different portions thereof can be adjusted such that the intensity level of the radiation that the next wafer is exposed to is uniform or more uniform.

In one aspect of the present disclosure, a semiconductor fabrication apparatus is disclosed. The semiconductor fabrication apparatus includes a holder configured to place a substrate, a radiation source configured to provide radiation to transfer a pattern onto the substrate, a plurality of sensing devices configured to provide a reference signal based on an intensity of the radiation when the substrate is not present, and a controller, operatively coupled to the plurality of sensing devices, configured to adjust the intensity of the radiation based on the reference signal.

In another aspect of the present disclosure, a semiconductor fabrication apparatus is disclosed. The semiconductor fabrication apparatus includes a holder configured to place a substrate, a radiation reception device configured to absorb radiation received over a top surface of the holder, and a circuit, electrically coupled to the radiation reception device, configured to generate a reference signal based on an intensity of the absorbed radiation. The reference signal can be substantially proportional to the intensity, thereby allowing the intensity to be adjusted accordingly.

In yet another aspect of the present disclosure, a method for fabrication semiconductor devices is disclosed. The method includes subsequently to exposing a first substrate placed on a holder with a radiation source, unloading the first substrate from the holder. The method also includes exposing the holder with the radiation source to generate a reference signal and determining a level of the reference signal that is substantially proportional to an intensity of the radiation source. The method also includes, prior to loading a second substrate, adjusting the intensity of the radiation source in response to determining that the level of the reference signal does not satisfy a predefined condition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication apparatus, comprising:
a holder to place a substrate;
a radiation source to provide radiation to transfer a pattern onto the substrate;
a plurality of sensing devices to provide a reference signal based on an intensity of the radiation when the substrate is not present; and
a controller, operatively coupled to the plurality of sensing devices, that is to adjust the intensity of the radiation based on the reference signal, wherein the plurality of sensing devices are arranged in an array across the top surface of the holder and are configured to detect radiation intensity only during intervals between substrate processing.

2. The apparatus of claim 1, wherein each of the plurality of sensing devices includes at least one radiation reception device to convert the radiation into an electrical signal, and wherein the radiation reception devices are arranged as an array disposed across a top surface of the holder.

3. The apparatus of claim 2, wherein each of the plurality of sensing devices includes a circuit, operatively coupled to a corresponding radiation reception device, that is to provide the reference signal that is substantially proportional to the intensity of the radiation.

4. The apparatus of claim 3, wherein the circuit includes:
a first transistor gated by a reset signal;
a second transistor gated by a charging signal substantially positively proportional to the electrical signal; and
a third transistor gated by a control signal;
wherein the second transistor is to be activated upon the charging signal being above a threshold thereby causing the third transistor to follow the electrical signal to provide the reference signal.

5. The apparatus of claim 4, wherein the radiation source includes a light source selected from the group consisting of: an extreme ultraviolet (EUV) lithography light source, a deep ultraviolet (DUV) lithography light source, an incoherent vacuum ultraviolet (VUV) lithography light source, and an argon fluoride (ArF) laser.

6. The apparatus of claim 3, wherein the circuit includes:
a first transistor powered by the radiation;
a second transistor powered by the radiation; and
an amplifier;
wherein the first and second transistors are alternately activated wherein the alternate activation of the first and second transistors causes the amplifier to provide the reference signal as an oscillation frequency signal.

7. The apparatus of claim 6, wherein the radiation source includes a light source selected from the group consisting of: an extreme ultraviolet (EUV) lithography light source, a deep ultraviolet (DUV) lithography light source, an incoherent vacuum ultraviolet (VUV) lithography light source, and an argon fluoride (ArF) laser.

8. The apparatus of claim 3, wherein the circuit includes:
a ring oscillator; and
an amplifier coupled to an output of the ring oscillator;
wherein the ring oscillator is biased by a supply voltage substantially positively proportional to the electrical signal thereby causing the amplifier to provide the reference signal as an oscillation frequency signal.

9. The apparatus of claim 8, wherein the radiation source includes a light source selected from the group consisting of: an extreme ultraviolet (EUV) lithography light source, a deep ultraviolet (DUV) lithography light source, an incoherent vacuum ultraviolet (VUV) lithography light source, and an argon fluoride (ArF) laser.

10. The apparatus of claim 1, wherein each of the plurality of sensing devices is independently activated to monitor the intensity of the radiation received over a respective portion of the holder.

11. A semiconductor fabrication apparatus, comprising:
a holder to place a substrate;
a radiation reception device comprising a plurality of pixels arranged in an array to absorb radiation received over a top surface of the holder, wherein the radiation reception device is configured to detect radiation intensity when no substrate is present on the holder; and
a circuit, electrically coupled to the radiation reception device, that is to generate a reference signal based on an intensity of the absorbed radiation;
wherein the reference signal is substantially proportional to the intensity, wherein the reference signal enables the intensity to be adjusted accordingly.

12. The apparatus of claim 11, wherein the radiation reception device includes a plurality of pixels, arranged in an array, that are to detect the intensity of the absorbed radiation.

13. The apparatus of claim 11, wherein the circuit is to be powered by the absorbed radiation.

14. The apparatus of claim 11, wherein the circuit includes a wireless transmitter to transmit the reference signal.

15. The apparatus of claim 11, wherein the circuit comprises a plurality of transistors, wherein a first one of the plurality of transistors is gated by a reset signal, and wherein a second one of the plurality of transistors is gated by a control signal.

16. A semiconductor fabrication apparatus, comprising:
a holder to place a substrate;
a radiation source to provide radiation to transfer a pattern onto the substrate;
a plurality of sensing devices to provide a reference signal based on an intensity of the radiation when the substrate is not present; and
a controller, operatively coupled to the plurality of sensing devices, that is to adjust the intensity of the radiation based on the reference signal;
wherein each of the plurality of sensing devices includes at least one radiation reception device to convert the radiation into an electrical signal, and wherein the radiation reception devices are arranged as an array disposed across a top surface of the holder, wherein the radiation reception devices are configured to detect radiation intensity only during intervals between substrate processing.

17. The apparatus of claim 16, wherein each of the plurality of sensing devices includes a circuit, operatively coupled to a corresponding radiation reception device, that is to provide the reference signal that is substantially proportional to the intensity of the radiation.

18. The apparatus of claim 17, wherein the circuit includes:
a first transistor gated by a reset signal;
a second transistor gated by a charging signal substantially positively proportional to the electrical signal; and
a third transistor gated by a control signal;
wherein the second transistor is to be activated upon the charging signal being above a threshold thereby causing the third transistor to follow the electrical signal to provide the reference signal.

19. The apparatus of claim 17, wherein the circuit includes:
a first transistor powered by the radiation;
a second transistor powered by the radiation; and
an amplifier;
wherein the first and second transistors are alternately activated wherein the alternate activation of the first and second transistors causes the amplifier to provide the reference signal as an oscillation frequency signal.

20. The apparatus of claim 17, wherein the circuit includes:
a ring oscillator; and
an amplifier coupled to an output of the ring oscillator;
wherein the ring oscillator is biased by a supply voltage substantially positively proportional to the electrical signal thereby causing the amplifier to provide the reference signal as an oscillation frequency signal.

* * * * *